(12) United States Patent
Adamski

(10) Patent No.: US 9,998,075 B1
(45) Date of Patent: Jun. 12, 2018

(54) LDO WITH FAST RECOVERY FROM SATURATION

(71) Applicant: pSemi Corporation, San Diego, CA (US)

(72) Inventor: Jaroslaw Adamski, Streamwood, IL (US)

(73) Assignee: pSemi Corporation, San Diego, CA (US)

(*) Notice: Subject to any disclaimer, the term of this patent is extended or adjusted under 35 U.S.C. 154(b) by 0 days. days.

(21) Appl. No.: 15/415,768

(22) Filed: Jan. 25, 2017

(51) Int. Cl.
| | |
|---|---|
| H03F 1/02 | (2006.01) |
| H03F 1/22 | (2006.01) |
| H03F 3/19 | (2006.01) |
| H03F 3/21 | (2006.01) |
| G05G 1/56 | (2008.04) |
| G05F 1/595 | (2006.01) |

(52) U.S. Cl.
CPC ......... *H03F 1/0233* (2013.01); *G05F 1/595* (2013.01); *H03F 1/223* (2013.01); *H03F 3/19* (2013.01); *H03F 3/21* (2013.01); *H03F 2200/451* (2013.01)

(58) Field of Classification Search
USPC ................. 330/297, 127, 129, 134, 279
See application file for complete search history.

(56) References Cited

U.S. PATENT DOCUMENTS

| | | | |
|---|---|---|---|
| 6,765,374 B1 | 7/2004 | Yang et al. | |
| 7,889,005 B2 | 2/2011 | Simon | |
| 8,487,706 B2 | 7/2013 | Li et al. | |
| 9,753,474 B2* | 9/2017 | Zhang | G05F 1/575 |
| 9,857,818 B1 | 1/2018 | Adamski | |
| 9,915,963 B1 | 3/2018 | Wu | |
| 2005/0007200 A1 | 1/2005 | Inoue et al. | |
| 2006/0132107 A1 | 6/2006 | Sicard | |
| 2006/0202760 A1 | 9/2006 | Simon | |
| 2007/0296501 A1 | 12/2007 | Matsui | |
| 2012/0139635 A1 | 6/2012 | Ho et al. | |
| 2012/0326768 A1 | 12/2012 | Bhattacharya et al. | |
| 2013/0093520 A1 | 4/2013 | Roux et al. | |
| 2015/0249437 A1 | 9/2015 | Morishita et al. | |
| 2017/0160757 A1 | 6/2017 | Yang | |

OTHER PUBLICATIONS

Choe, Henry, Notice of Allowance received from the USPTO dated Jan. 16, 2018 for U.S. Appl. No. 15/451,184, 45 pgs.
Choe, Henry, Office Action received from the USPTO dated Nov. 30, 2017 for U.S. Appl. No. 15/451,184, 10 pgs.

(Continued)

*Primary Examiner* — Hieu Nguyen
(74) *Attorney, Agent, or Firm* — Jaquez Land Greenhaus LLP; Martin J. Jaquez, Esq.; Marc Parvaneh, Esq.

(57) ABSTRACT

Systems, methods and apparatuses for efficient control of a pass device driven into its triode region of operation are described. Output drive capability of an operational amplifier driving the pass device is boosted during a transition of the pass device from operating in a triode region to operating in a saturation region. An exemplary implementation of an LDO controlling pass devices for providing burst RF power to a power amplifier is described. An alternative configuration that boosts the driving capability of the operational amplifier using an asymmetrical mirroring circuit is also described.

25 Claims, 10 Drawing Sheets

(56) References Cited

OTHER PUBLICATIONS

Kovac, David, Response filed in the USPTO dated Dec. 12, 2017 for U.S. Appl. No. 15/451,184, 12 pgs.
Pham, Emily P., Notice of Allowance received from the USPTO dated Jan. 16, 2018 for U.S. Appl. No. 15/642,204, 14 pgs.
Goethals, Filip, International Search Report and Written Opinion received from the EPO dated Mar. 13, 2018 for appln. No. PCT/US2017/068052.

* cited by examiner

LDO WITH FAST RECOVERY FROM SATURATION

TECHNICAL FIELD

The present application generally relates to electronic circuitry, and more specifically to low dropout (LDO) regulators with fast recovery from saturation of corresponding pass transistors

BACKGROUND

A low dropout (LDO) regulator can be used to provide regulated power to an electronic device at a level close to a level of a power source provided to the LDO regulator. FIG. 1 shows an exemplary case where an LDO regulator (110) is used to provide power to a radio frequency (RF) power amplifier (150) based on a power source Vbatt. The LDO regulator (110) comprises an operational amplifier (115) whose output is connected to a current driver circuit (120) capable of handling current high enough for operation of the RF power amplifier (150) at a desired output voltage of the LDO regulator, LDO_out. Such output voltage, LDO_out, is sampled through, for example, a voltage division network formed by resistors (R1, R2) and fed back to the positive input terminal of the operational amplifier (115), to create a closed loop control of the output voltage LDO_out such as to track an input voltage fed to the inverting input terminal of the operational amplifier (OpAmp) (115). In the described closed loop mode of operation, the LDO regulator (110) regulates the output voltage LDO_out to remain substantially constant irrespective of the current required by the RF power amplifier during operation.

With further reference to FIG. 1, the current driver circuit (120) can comprise one or more transistor devices, such as P-type MOSFETs (PMOS), which during regulation of the output voltage, LDO_out, operate in their respective saturation regions of operation and can therefore provide a corresponding high enough gain for operation of the above described closed loop control.

As known to a person skilled in the art, transistors of the current driver circuit (120), also referred to as "pass transistors", or "pass devices", can contribute to a power loss, which in some cases may be a disadvantage. Accordingly, it can be desirable to minimize such power loss in the pass devices, which can be achieved by driving the pass devices into their respective triode (linear) regions of operation by applying a corresponding biasing voltage to the gates of the pass devices. When driven into their respective triode regions of operation, the pass devices have a very low gain which can cause the LDO to operate in essentially an open loop mode where the input voltage is not tracked and therefore the LDO_out voltage is not regulated. Due to the capacitive loading presented by the pass device (101) connected to the output of the OpAmp (115), driving the pass device (101) back into its saturation region of operation can be delayed by a time it takes the output of the OpAmp (115) to discharge the capacitive load. It can be desirable to reduce such delay while maintaining a low power operation of the OpAmp (115) as described in the following paragraphs.

SUMMARY

According to a first aspect of the present disclosure, a circuital arrangement for providing burst power at an output voltage node is presented, the circuital arrangement comprising: a pass device, configured to provide a conduction path between a supply voltage node and the output voltage node through operation of the pass device in one of a saturation region and a triode region of the pass device; an operational amplifier, coupled, through an output node of the operational amplifier, to the pass device, the operational amplifier configured to provide a control voltage to the pass device to control the region of operation and biasing of the pass device; and a current boost circuit coupled to the output voltage node and to the output node of the operational amplifier, the current boost circuit comprising a mirrored circuit that mirrors an output stage of the operational amplifier in correspondence of the output node to provide a mirrored output node; wherein: the current boost circuit is configured to provide a current boost to the operational amplifier to increase a current drive capability of the output stage of the operational amplifier during a transition of the pass device from one of the saturation region and the triode region of operation to the other of the saturation region and the triode region of operation based on a detected ramping of the control voltage at the mirrored output node.

According to a second aspect of the present disclosure, a circuital arrangement for providing burst power at an output voltage node is provided, the circuital arrangement comprising: a pass device, configured to provide a conduction path between a supply voltage node and the output voltage node through operation of the pass device in one of a saturation region and a triode region of the pass device; an operational amplifier, coupled, through an output node of the operational amplifier, to the pass device, the operational amplifier configured to provide a control voltage to the pass device to control the region of operation of the pass device; and a current boost circuit coupled to the output voltage node and to the output node of the operational amplifier, the current boost circuit comprising a mirrored asymmetrical circuit that mirrors an output stage of the operational amplifier in correspondence of the output node to provide a mirrored asymmetrical output node; wherein: the current boost circuit is configured to provide a current boost to the operational amplifier to increase a current drive capability of the output stage of the operational amplifier during a transition of the pass device from one of the saturation region and the triode region of operation to the other of the saturation region and the triode region of operation based on a detected ramping of the control voltage at the mirrored asymmetrical output node.

According to a third aspect of the present disclosure, a circuital arrangement for providing burst power at an output voltage node is provided, the circuital arrangement comprising: a pass device, configured to provide a conduction path between a supply voltage node and the output voltage node through operation of the pass device in one of a saturation region and a triode region of the pass device; an operational amplifier, coupled, through an output node of the operational amplifier, to the pass device, the operational amplifier configured to provide a control voltage to the pass device to control the region of operation of the pass device; and a current boost circuit coupled to the output voltage node and to the output node of the operational amplifier, the current boost circuit comprising a mirrored asymmetrical circuit that mirrors an output stage of the operational amplifier in correspondence of the output node to provide a mirrored asymmetrical output node; wherein: the current boost circuit is configured to provide a current boost to the operational amplifier to increase a current drive capability of the output stage of the operational amplifier during a detected ramping of the control voltage at the mirrored asymmetrical output node.

According to a fourth aspect of the present disclosure, a method for controlling power of a radio frequency (RF) power amplifier (PA) is presented, the method comprising: providing a supply voltage; providing an operational amplifier; coupling an output node of the operational amplifier to a control terminal of a pass device, the pass device configured to operate in one of a triode region and a saturation region; coupling a first terminal of the pass device to the supply voltage; coupling a second terminal of the pass device to an RF power control terminal of the RF PA; mirroring an output stage of the operational amplifier; based on the mirroring, providing a mirrored output node, the mirrored output node having a capacitive load substantially smaller than a capacitive load of the output node in correspondence of a capacitance at the control terminal of the pass device; inputting a ramp voltage to the operational amplifier; based on the inputting, detecting the ramp voltage at the mirrored output node; based on the inputting, controlling the pass device to transition from one of the triode region and the saturation region to the other region; based on the detecting and the controlling, detecting the transition; based on the detecting the transition, injecting a current boost into the operational amplifier; based on the injecting, increasing a current drive capability of the output stage; based on the increasing, controlling a transition time of the pass device to transition from the one of the triode region and the saturation region to the other region; and based on the controlling, reducing an error voltage at the RF power control terminal of the RF PA, wherein the error voltage is in correspondence of a desired voltage dictated by the input ramp voltage and an effective voltage at the RF power control terminal.

According to a fifth aspect of the present disclosure, a method for increasing a current drive capability of an amplifier is presented, the method comprising: providing a supply voltage; providing an operational amplifier; coupling an output node of the operational amplifier to a control terminal of a pass device, the pass device configured to operate in one of a triode region and a saturation region; coupling a first terminal of the pass device to the supply voltage; coupling a second terminal of the pass device to an RF power control terminal of the RF PA; asymmetrically mirroring an output stage of the operational amplifier; based on the asymmetrically mirroring, providing an asymmetrical mirrored output node, the asymmetrical mirrored output node having a capacitive load substantially smaller than a capacitive load of the output node in correspondence of a capacitance at the control terminal of the pass device; inputting a ramp voltage to the operational amplifier; based on the inputting, detecting the ramp voltage at the asymmetrical mirrored output node; based on the detecting, injecting a current boost into the operational amplifier, and based on the injecting, increasing a current drive capability of the output stage.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
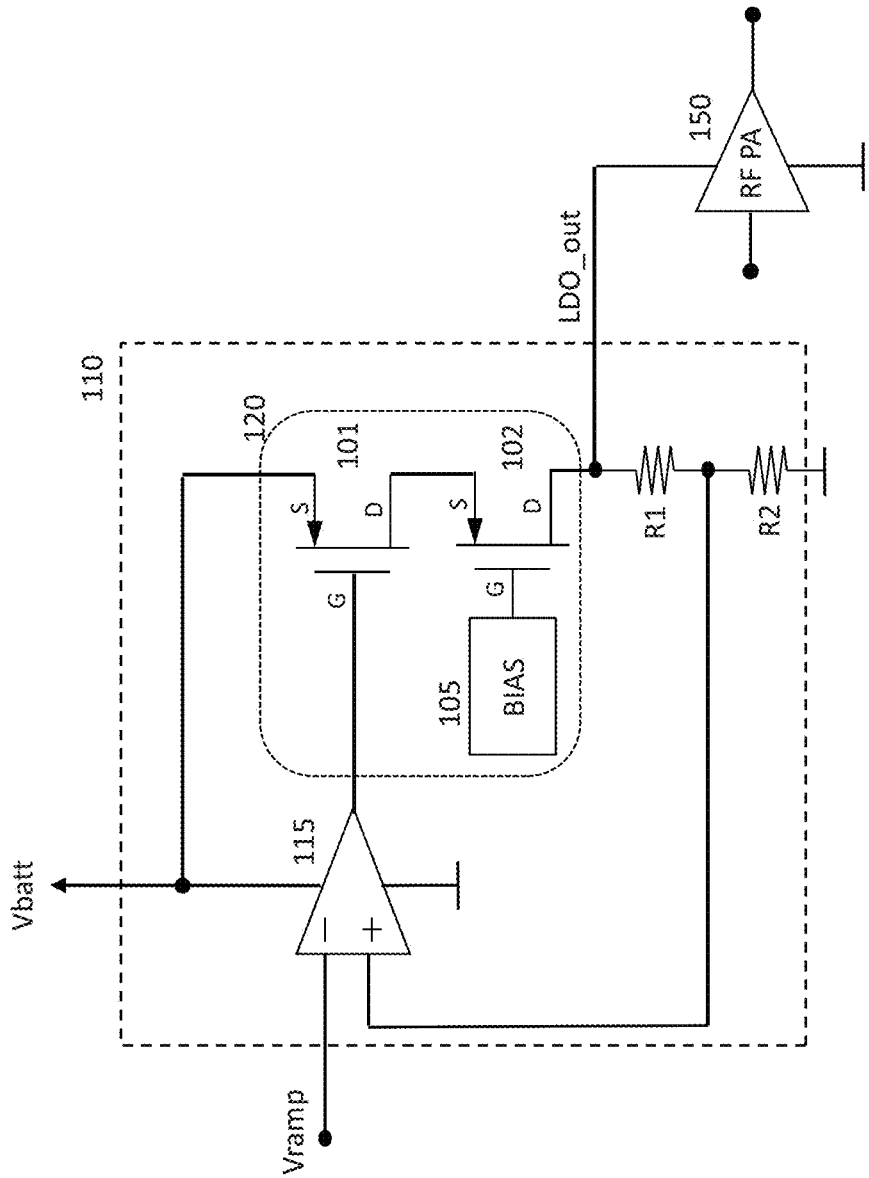
FIG. 1 is a simplified schematic representation of an RF power amplifier whose power is controlled by an LDO regulator. Power to the RF power amplifier is controlled by a control voltage, Vramp, input to a low power amplifier of the LDO regulator, where the LDO regulator outputs a power, based on the Vramp control voltage and a supply voltage (Vbatt).

As shown in FIG. 1, an LDO regulator (110) can be used to control power to an RF power amplifier (RF PA) (150). The LDO regulator comprises a low power OpAmp (115) which drives a high current pass device (101) to provide power to the RF PA (150). An additional second pass device (102) can be used in a cascode configuration to allow for a larger voltage drop across the combination of the pass devices (101, 102), where the larger voltage drop can be substantially equal to the voltage of the supply Vbatt (e.g.

3.5 volts for a handheld cell phone). According to some embodiments the pass devices can be in a cascoded configuration with a dedicated biasing circuit (105) for biasing the additional device.

The person skilled in the art will understand that based on the supply voltage Vbatt, two or more pass devices configured in a series connection as depicted in FIG. 1 may be used as a voltage across the pass devices can be as high as the supply voltage. As known to the person skilled in the art, due to the cascoded configuration of the pass devices (101, 102), biasing of the pass device (102) not driven by the OpAmp (115) is controlled by the pass device (101) in combination with the biasing circuit (105). For the case depicted in FIG. 1 where two pass devices (101, 102) are used, a simple exemplary basing circuit (105) can comprise two resistors configured as a voltage divider network to provide a fixed gate voltage substantially equal to half the supply voltage Vbatt to the gate of the pass device (102). It should be noted that the two resistors voltage divider is a mere exemplary implementation case and should not be considered limiting, as a person skilled in the art would know of other circuits capable of producing the fixed gate voltage. As biasing of pass devices (e.g. 102) not driven by the OpAmp (115) are controlled by the pass device (101), switching, based on the control voltage Vramp, of such pass devices (e.g. 102) between their respective modes of operation (triode, saturation) follow the speed at which the pass device (101) switches, and therefore in the following sections only operation of the pass device (101) driven by the OpAmp (115) is discussed.

With further reference to FIG. 1, the RF PA (150) can be used to generate RF power in a GSM system, where the burst of GSM RF power is controlled by the LDO_out voltage that varies between a low voltage corresponding to essentially no power, and a high voltage that corresponds to maximum power. In some exemplary embodiments, the LDO_out voltage can vary between 0 volts and 3.4 volts, which in turn can result in an RF output power within a range of approximately [−54, 35] dBm for Low Band GSM operation. It should be noted that the lowest voltage level of the LDO_out voltage combined with the voltage level of the supply voltage Vbatt can determine a minimum number of the cascoded pass transistors necessary to withstand a corresponding voltage drop across such transistors.

The LDO_out voltage that controls the RF power to the RF PA (150) is controlled by the Vramp control voltage fed to the inverting input of the OpAmp (115). In one exemplary embodiment, the Vramp is within a range of [0, 1.6] volts which corresponds to a scale factor of approximately 3.4/1.6 with respect to the LDO_out voltage for a case where the supply voltage Vbatt is 3.4 volts. Such scale factor can be provided by the resistors R1, R2 which divide the LDO_out voltage according to the scaling factor.

Figure 3A:
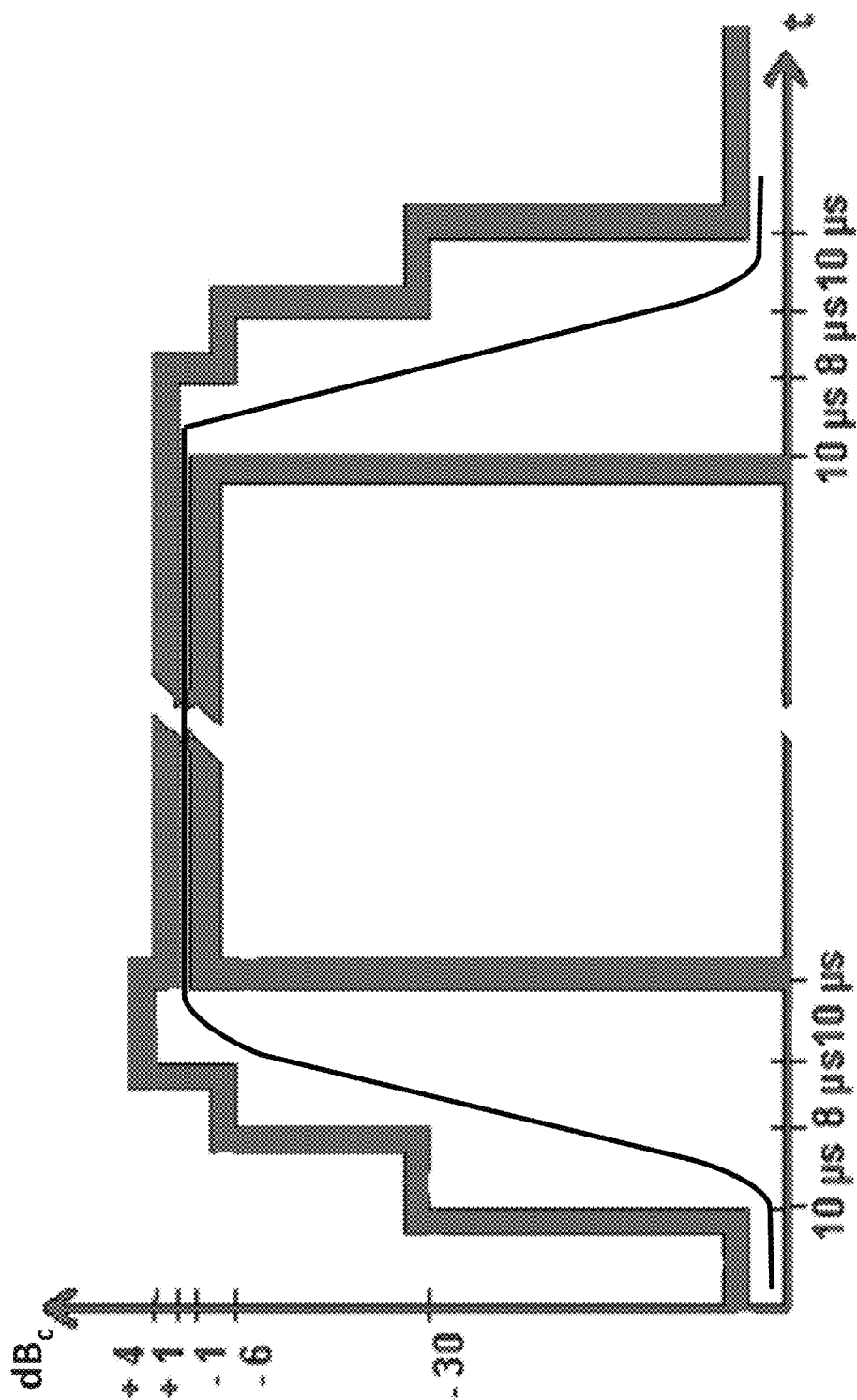
FIG. 3A shows a graph representing a global system for mobiles (GSM) RF burst time mask requirement for generating RF power in a GSM system and an RF power generated according to the mask by way of the RF power amplifier of FIG. 1.

As known to a person skilled in the art, GSM transmission occurs in specific RF bursts that can be controlled by the Vramp signal input to the OpAmp (115). FIG. 3A, later discussed, shows a graph representing a GSM RF burst time mask requirement for generating the specific RF bursts. In order to achieve higher efficiency and power, it may be desirable to minimize loss in the pass devices (101, 102) at full power. Such higher efficiency and power can be achieved by driving the pass devices (101, 102) into their respective triode regions of operation in which the pass devices exhibit a very small $R_{ON}$ resistance (between source and drain). According to some embodiments, the size of the pass device (101, 102) is made large enough to reduce the size of the corresponding $R_{ON}$ resistance when operating in the triode region for a lower power consumption of the pass device, and therefore higher operating efficiency and higher power of the RF PA (150). According to an exemplary embodiment, the maximum current at full power drawn by the RF PA (150) from the supply Vbatt can be up to 2 A in which case a target $R_{ON}$ of 100 mΩ or less can be desirable in order to reduce the loss in the pass devices (101, 102) and maximize efficiency of the RF PA (150) at maximum RF power. As known to a person skilled in the art, as size of the pass device (101, 102) increases, so does a corresponding gate-to-source Cgs capacitance. In some embodiments Cgs of the pass device when operating in the triode region of operation can be approximately equal to or large than 220 pF.

As noted above, the LDO normally operates in a regulated mode, where the output voltage LDO_out follows the input control voltage Vramp according to a closed loop control system defined by the gains of the OpAmp (115), the pass devices (101, 102) operating in the conventional saturation region, and the sampling voltage division network (R1, R2). When under control of the input control voltage Vramp, the OpAmp (115) drives the pass devices (101, 102) into operating in their respective triode regions, gain of the pass devices (101, 102) is drastically reduced, which in turn drastically reduces the gain of the closed loop control system for an effective operation of the LDO in a non-regulated mode, where the LDO_out voltage follows the supply voltage Vbatt with a small drop due to the $R_{ON}$ resistance of the pass devices (101, 102) operating in the triode region.

With continued reference to FIG. 1, the large Cgs capacitance (e.g. ≥220 pF) due to the relatively large size of the pass transistors (101, 102) used to reduce the $R_{ON}$ resistance, can cause a larger charge to accumulate at the gate of the pass devices (101, 102), which in turn can require a larger current for discharging such larger charge in a given amount of time, or alternatively, require a larger time to discharge such larger charge for a given driving current capability. This means that the OpAmp (115), which drives the gate of the pass device (101), needs to either operate at a higher output drive to drive the pass device (101) from one operating region to another in a given amount of time, or to take a longer time to drive the pass device (101) from one operating region to the other. As known to a person skilled in the art, the effective value of the Cgs capacitance changes as a function of the region of operation of the pass device, which can be ⅔ (~0.67x) of the gate channel capacitance in saturation region and full gate channel capacitance in linear or triode region. As known to a person skilled in the art, gate channel capacitance is defined as Cox*Leff*W, where Cox is the oxide capacitance per unit area between the gate and the channel of the device, Leff is the effective channel length of the device, and W is the width of the device. Charging the gate to maximum safe voltage enables the reduction of the Ron resistance of the pass devices. It, however, requires considerable driving current from the OpAmp (115), especially in the triode region of operation.

Based on the above, designing the OpAmp (115) for a higher current capability as dictated by the larger capacitive load of the pass device (101) when operating in the triode region of operation can result in a less efficient overall design as such mode of operation of the pass device (101) is not constant (e.g. GSM burst mode of operation). According to an embodiment of the present disclosure, a current boost is provided to the output drive of the OpAmp (115) only during a time where the pass device (101) is driven from the triode region of operation to the saturation region of operation. This can allow for a reduction in a delay to drive the pass device (101) back into its saturation mode of operation due to the discharging of the Cgs capacitance of the pass device (101) while minimizing power consumption of the OpAmp (115). As a consequence, a reduction in switching time between a low gain (quasi open loop) unregulated mode of operation of the LDO regulator (110) to a high gain, closed loop control, regulated mode of operation of the LDO regulator (110) is obtained.

Figure 2:
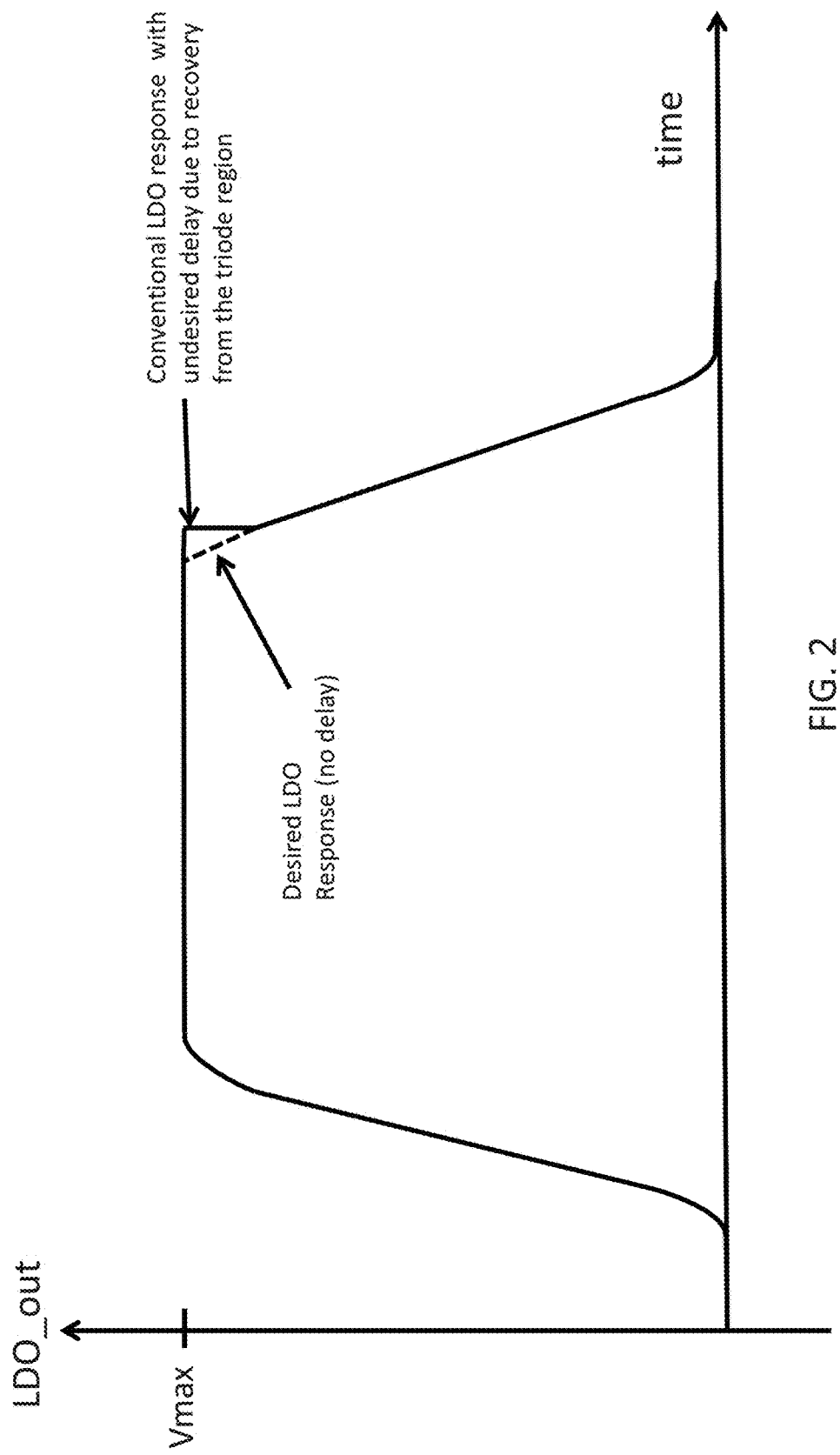
FIG. 2 shows a graph representing an output power response of a conventional LDO regulator for controlling an RF power amplifier that operates in a burst mode, where such response exhibits an undesired delay in the trailing edge due to a slow recovery of the LDO regulator from operating corresponding pass devices from a triode region to a saturation region. Dotted portion of the graph in FIG. 2 shows a response of an LDO regulator according to the present disclosure, where the undesired trailing edge delay is removed.

FIG. 2 shows a graph, in solid line, representing an output voltage response of the LDO regulator (110), LDO_out, for controlling an RF power amplifier (e.g. 150 of FIG. 1) that operates in a burst mode. As previously mentioned, such output voltage is also representative of the output RF power of the RF power amplifier (150) whose power is controlled by the LDO regulator (110). As can be seen in the graph of FIG. 2, such output voltage response exhibits an undesired delay in the trailing edge due to a slow recovery of the LDO regulator (110) from operating in the unregulated low gain mode to the regulated high gain mode. With reference to the leading edge of the graph in FIG. 2 represented by a solid line, such edge follows a control voltage Vramp at the inverting input terminal of the OpAmp (115) as the LDO regulator (110) operates at a high gain regulated mode. As the control voltage Vramp increases, the OpAmp (115) gradually drives the pass device (101) into its triode mode of operation for operation of the LDO regulator (110) at a low gain unregulated mode where LDO_out voltage reaches maximum voltage Vmax, substantially equal to the supply voltage Vbatt (actually equal to Vbatt minus a voltage drop across the pass devices, as explained later).

With reference to the trailing edge of the graph in FIG. 2, as the control voltage Vramp decreases to reduce the output voltage LDO_out, the above discussed slow recovery of the LDO regulator (110) from the low gain to the high gain of operation translates to a non-conformance of the response to the Vramp control voltage during a time it takes the OpAmp (115) to discharge the Cgs of the pass device (101) for driving the pass device (101) into its saturation region of operation. During such time, instead of following the Vramp control voltage, as indicated by the dotted portion of the trailing edge of the graph in FIG. 2, the output power response remains flat at Vmax, therefore full power for the RF PA (150)). Once the pass device (101) recovers from operation in the triode region, the LDO operates in the high gain regulated mode and the output power quickly converges to the desired power and tracks the Vramp control voltage. As known to a person skilled in the art, such quick convergence can result in undesired switching transients and the extra time during which the output response remains flat and not tracking the Vramp control voltage can adversely affect efficiency of operation.

With further reference to the graph of FIG. 2, it should be noted that the extra time where the output response remains flat can be identified by two conditions: first, the pass device (101) operates in its triode region of operation, and second, the OpAmp (115) is ramping down under control of the Vramp control voltage. According to an embodiment of the present disclosure, upon detection of these two conditions an extra current is provided to the output drive of the OpAmp (115) to allow for a quick discharge of the Cgs capacitance and therefore a quick recovery of the LDO regulator (110) to operating in the high gain regulated mode of operation. Such injection of current can allow the output voltage response of FIG. 2 to follow the dotted line during the trailing edge and therefore provide a smoother transition from unregulated full power to regulated power for a reduction in switching transients and increased efficiency of operation.

FIG. 3A shows a graph representing a global system for mobiles (GSM) RF burst time mask requirement for generating RF power in a GSM system and an RF power generated according to the mask by way of the RF power amplifier of FIG. 1 under control of the LDO regulator (110). RF power is generated in bursts that have to meet stringent time mask requirements. According to the time mask requirements, the LDO regulator (110) needs to ramp up the RF PA (150) to full power in approximately 10 to 15 µsec. The same is true for the ramping down of the RF PA (150) to minimum power. As previously notes, the LDO regulator (110) is controlled by the "Vramp" control voltage that is shaped very specifically to enable the RF PA (150) output power to meet the time mask requirements represented in FIG. 3A. It should be noted that the power unit in the graph of FIG. 3A is indicated in decibels relative to a carrier, dBc, and that ruptured lines in the timescale are used to mainly highlight regions of interest of the time mask requirement, namely the leading/trailing edges.

Figure 3B:
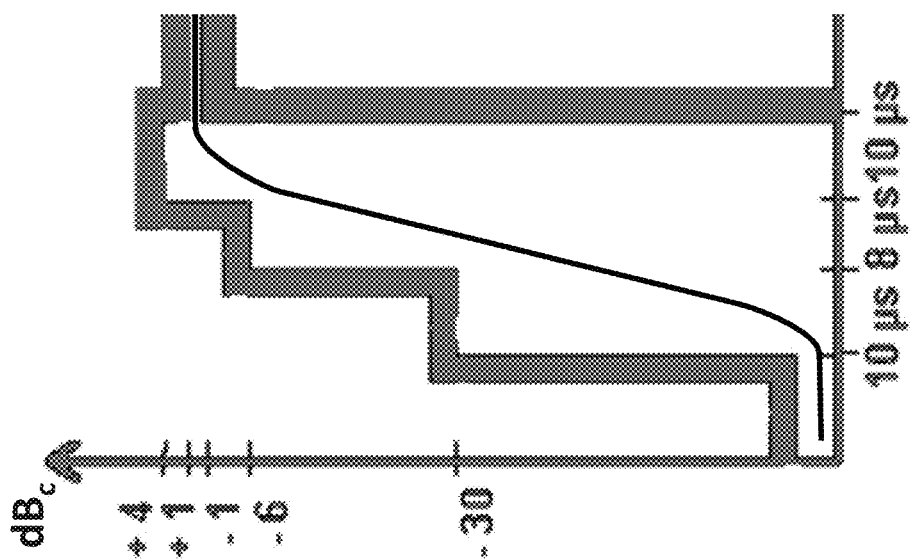
FIG. 3B shows a leading edge portion of the graph represented in FIG. 3A.

FIG. 3B shows a leading edge portion of the graph represented in FIG. 3A. When working at maximum power, the OpAmp (115) drives the pass device (101) into its triode region of operation to achieve low $R_{ON}$ resistance. This requires charging the Cgs capacitance of the pass device (101) to close to the maximum gate-to-source voltage Vgs allowed for that device, which according to an exemplary embodiment of the present disclosure can be around 2.5V. As can be seen with the graph of FIG. 3B, the resulting Cgs charging profile naturally aligns with the requirements of the mask, smoothly ramping the RF power to maximum. Such smooth ramping of the RF power to maximum is desired as it avoids overshoots and meets the time masks requirements and reduces RF switching transients.

Figure 3C:
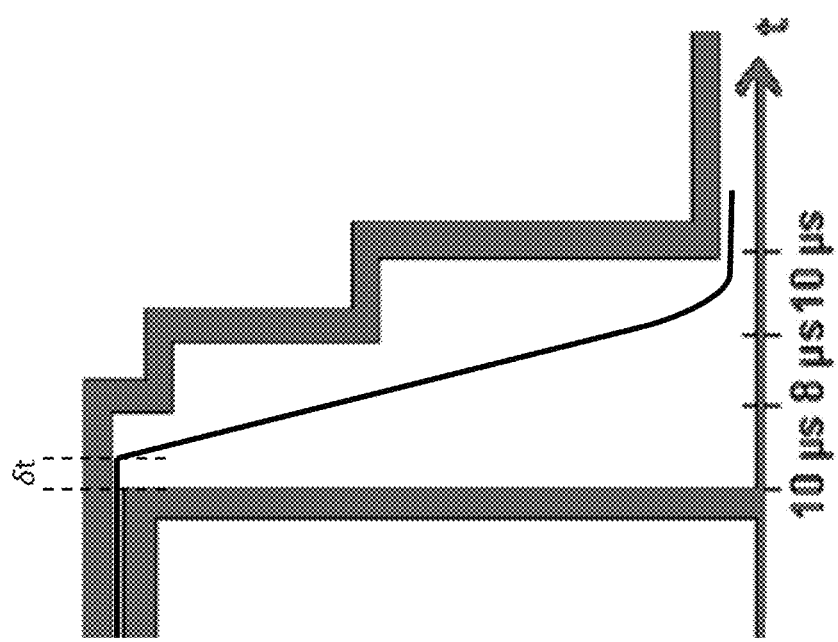
FIG. 3C shows a trailing edge portion of the graph represented in FIG. 3A which includes an undesired delay due to the time it takes a pass transistor of the LDO regulator to exit the triode region of operation.

FIG. 3C shows a trailing edge portion of the graph represented in FIG. 3C which includes an undesired delay due to the time it takes a pass transistor of the LDO regulator to exit the triode region of operation. According to some exemplary embodiments, such delay, δt, can be in the order of 1 to 2 µs and can therefore waste additional power. As can be seen in FIG. 3C, a different situation occurs with the trailing edge of the graph when compared to the leading edge discussed above with reference to FIG. 3B. As Cgs of the pass device (101) is already charged (e.g. to around 2.5V) and it takes a long time for the OpAmp (115) to discharge it to drive the pass device (101) out of its triode region of operation and into its saturated region of operation to effectively ramp down the RF power. This can result in too much delay and reduced margins with respect to meeting the time mask requirements as seen in the graph of FIG. 3C.

Figure 6:
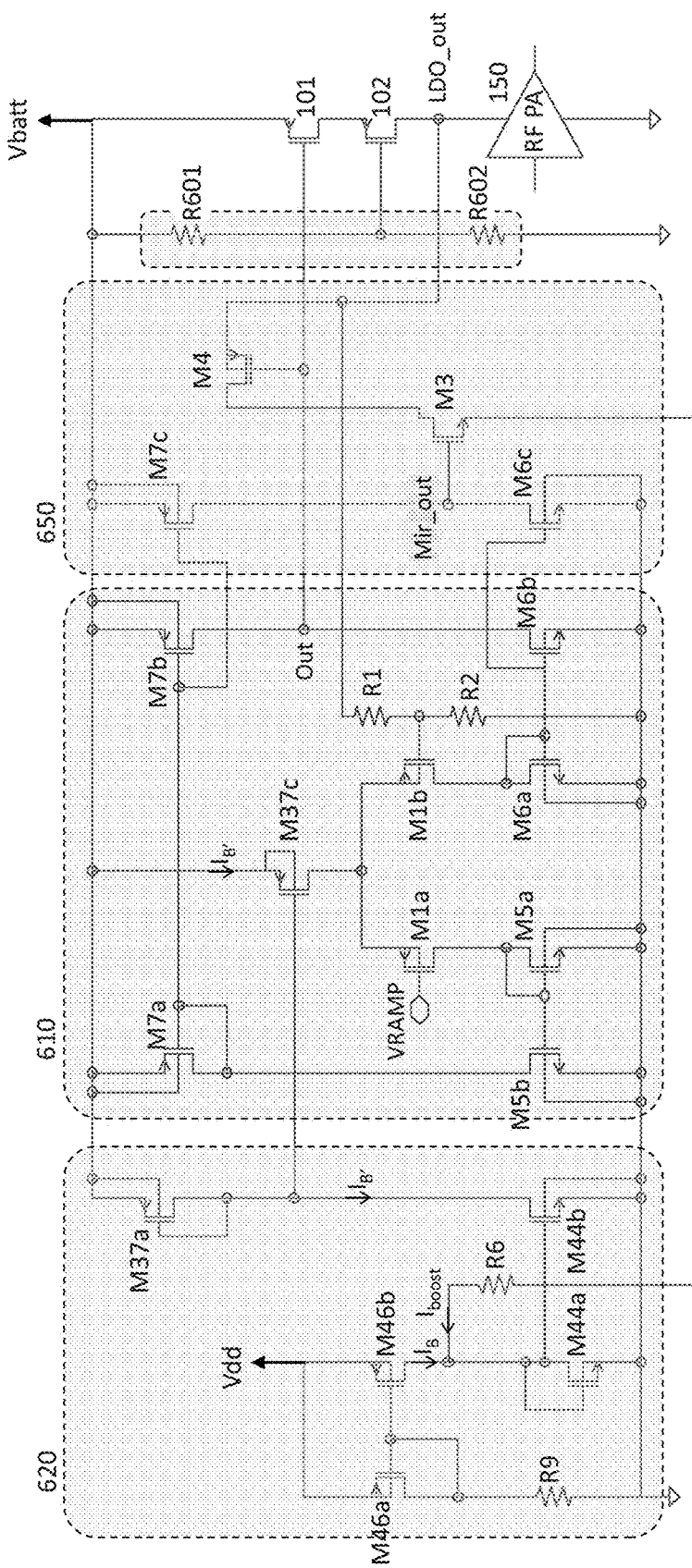
FIG. 6 shows a more detailed schematic representation of the LDO regulator of FIG. 1, where a current boosting circuit according to an embodiment of the present disclosure is used. Such current boosting allows boost of a current to an operation amplifier during a portion of a ramping of an output of the operational amplifier when a mode of operation of an active device coupled to the output of the operational amplifier transitions from one mode to another.

As noted above and according to an embodiment of the present disclosure, such delay, δt, can be reduced by injecting a current at the output drive of the OpAmp (115) when the pass device (101) operates in the triode region and the OpAmp (115) has started to ramp down. According to a further embodiment of the present disclosure, injection of such current is stopped as soon as the pass device (101) is driven out of its triode mode of operation. Such injection of current according to the present disclosure can be performed by a current boost circuit coupled to an output stage of the OpAmp (115) and coupled to the pass devices (101, 102) as depicted in FIG. 6 later described.

Figure 4:
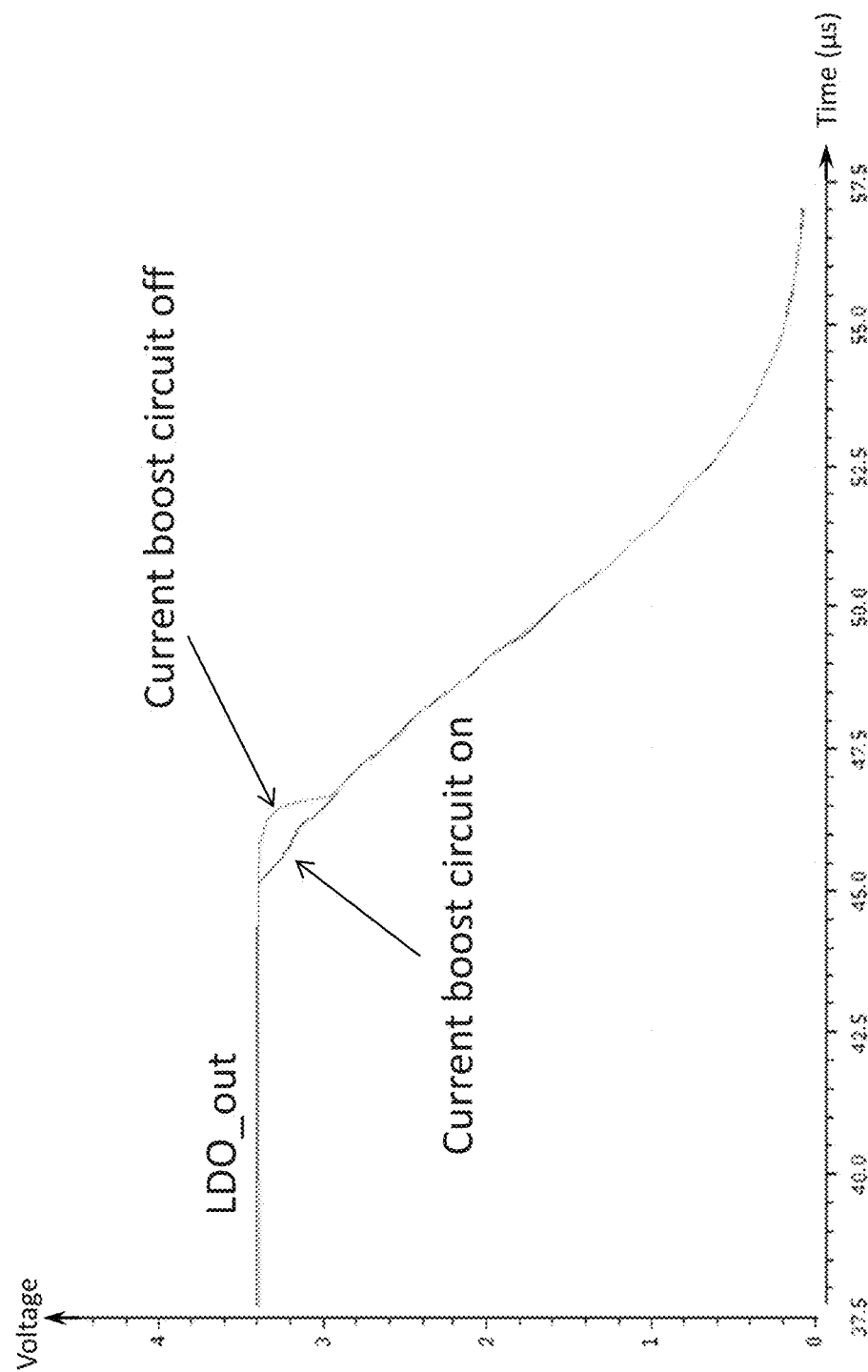
FIG. 4 shows a graph representing simulated output voltage LDO_out of a conventional LDO regulator and an LDO regulator according to the present disclosure where a current boost is used for fast recovery of the pass transistor from the triode region to the saturation region of operation.

FIG. 4 shows graphs representing simulation results of the LDO_out voltage, which controls RF power of the RF PA (150), with the current boost circuit according to the present disclosure ON and OFF. As can be seen in FIG. 4, such graphs follow each other at all time except during a transition region from the flat high voltage region of the graph to the start of the trailing edge. As discussed above and depicted in graphs of FIG. 4, providing a current boost can enable a smoother trailing edge with minimized transition delay.

Figure 5A:
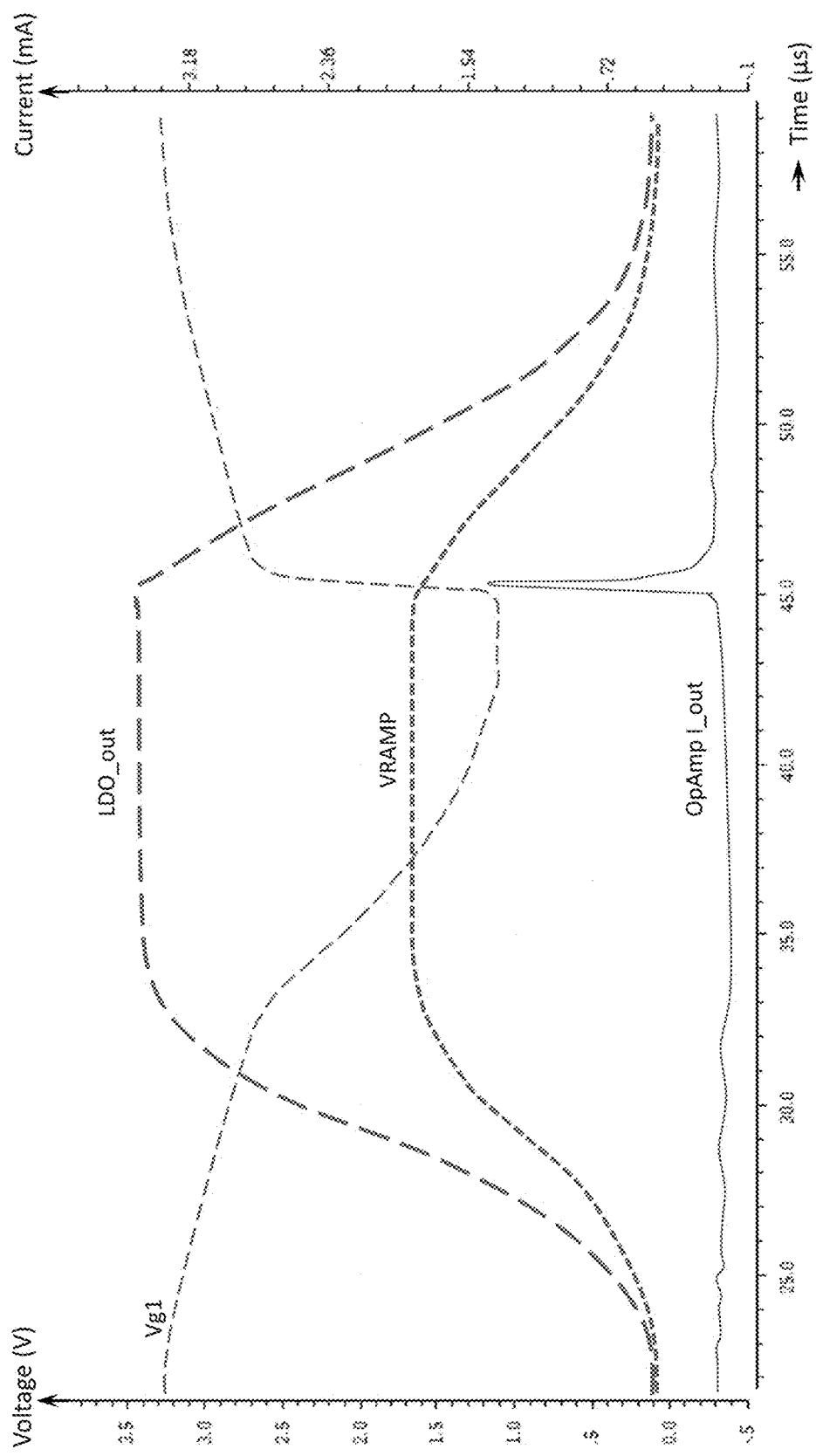
FIG. 5A shows graphs representing simulated signal levels of the LDO regulator with current boost according to the present disclosure.

FIG. 5A shows graphs representing simulated signal levels of the LDO regulator according to the present disclosure with current boosting enabled. As can be seen in the graphs FIG. 5A, as the Vramp voltage ramps up, so does the LDO_out voltage while the gate voltage (Vg1) of the pass device (101) decreases to reach a gate voltage (e.g. close to 2.5 V) that corresponds to a triode region of operation of the pass device (101). During the triode region of operation, the gate voltage (Vg1) further decreases while LDO_out voltage remains at its maximum level (close to Vbatt). As the Vramp voltage starts to ramp down, current boosting is triggered, which boosts the OpAmp (115) output current (OpAmp I_out) into the gate of the pass device (101) to enable fast recovery of the pass device (101) into the saturation region of operation by quickly discharging the gate voltage of the pass device (101). Current boosting ends as soon as the pass device (101) exits the triode region to smoothly transition into the saturation region and therefore provides a regulated LDO_out voltage which tracks the ramping down Vramp voltage.

Figure 5B:
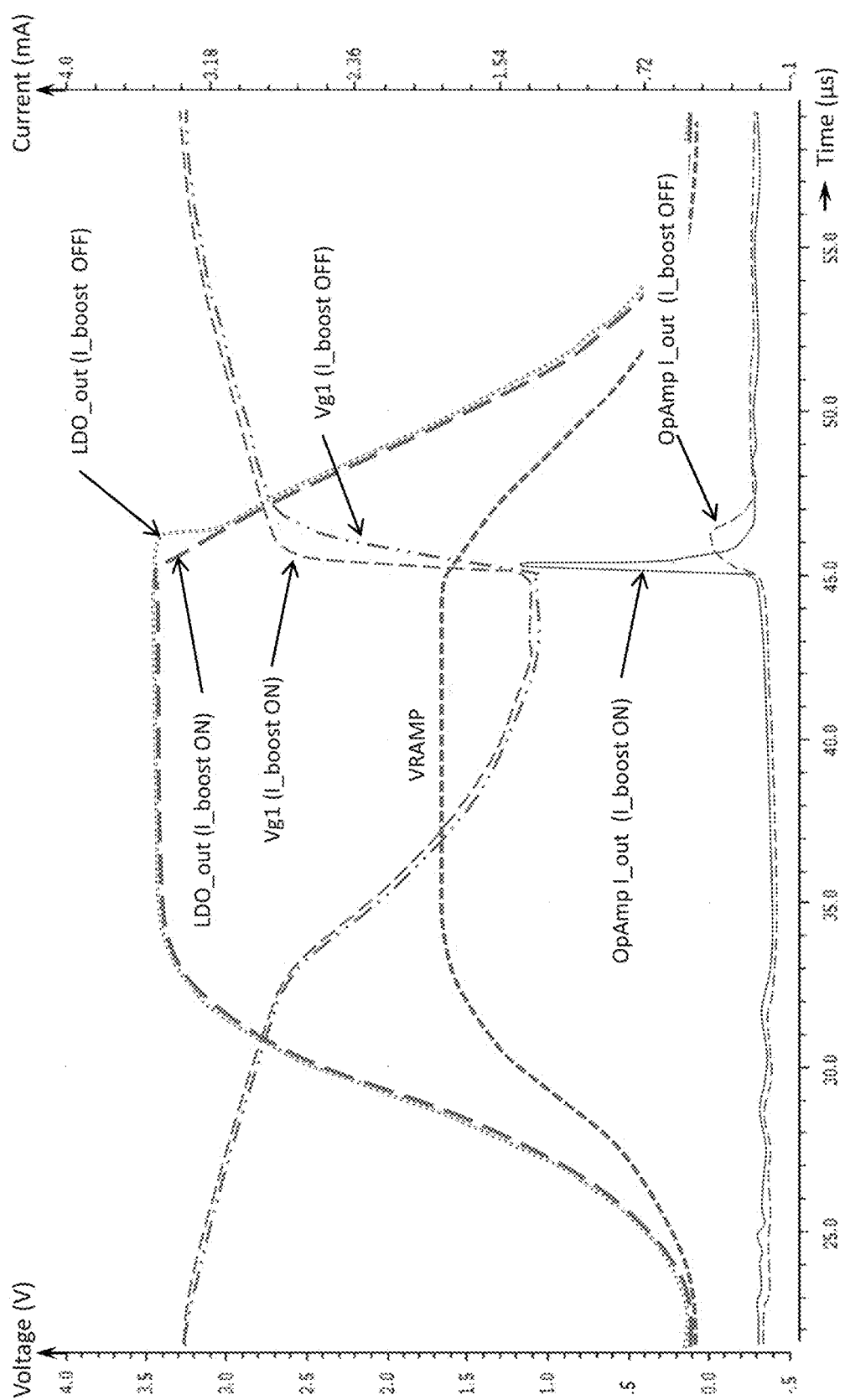
FIG. 5B shows graphs representing simulated signal levels of the LDO regulator operating in the conventional mode (no current boost) and graphs representing simulated signal levels of the LDO regulator with current boost according to the present disclosure.

FIG. 5B contrasts the graph of FIG. 5A (labeled "I_boost ON") with a graph representing simulated signals levels of the LDO regulator operating without current boosting (labeled "I_boost OFF"). As can be seen in the graphs of FIG. 5B, insufficient driving current (OpAmp I_out (I_boost OFF)) of the OpAmp (115) into the gate of the pass device (101) causes a slow recovery (as seen be the slope of Vg1 (I_boost OFF)) of the pass device into the saturation region of operation which in turn causes the LDO_out voltage to not immediately follow the Vramp voltage as the latter starts to ramp down and thus creating an undesired delay in the trailing edge response of the LDO_out voltage (and therefore in the RF output power).

FIG. 6 shows a more detailed schematic representation of the LDO regulator (110) of FIG. 1 used to control power of the RF PA (150) where a current boosting circuit (650), according to the present disclosure, is used to speed up recovery of the pass device (101) from a triode region of operation to a saturation region of operation. In particular, detailed circuital representation of an exemplary OpAmp (115) can be seen, which includes a main differential OpAmp section (610) comprising a differential PMOS input stage (M1a, M1b) for input of signals to corresponding inverting (Vramp) and non-inverting (LDO_out) input terminals, and a biasing circuit (620) used to provide biasing (tail) current ($I_{B'}$) to the differential OpAmp section (610) via transistor M37c, by current mirroring the current in the output leg of the biasing circuit (M37a, M44b). It should be noted that according some embodiments, the biasing circuit (620) can be powered by a separate voltage Vdd from the supply voltage Vbatt provided to the remaining part of the circuit of FIG. 6. According to some embodiments, such voltage Vdd can be based on the supply voltage Vdd.

As can be seen in the schematic representation of FIG. 6, Vramp control voltage is fed to a first (inverting) input terminal of the differential OpAmp section (610) and a scaled version of the LDO_out voltage, through resistors (R1, R2), is fed to the second (non-inverting) input terminal of the differential OpAmp section (610). It should be noted that the various MOSFETs shown in FIG. 6 are each represented by four terminals, where a fourth terminal is representative of a body terminal of a MOSFET device. Usage of such four-terminal devices should not be considered as limiting the scope of the present disclosure, as alternative embodiments, using three-terminal MOSFETs and/or a combination of three-terminal and four-terminal MOSFETs are within the reach of a person skilled in the art. Similarly, usage of MOSFETs should not be considered as limiting the scope of the present disclosure, as alternative embodiments using bipolar transistors based on the disclosed embodiments are also within the reach of a person skilled in the art.

According to an embodiment of the present disclosure, scaling of the LDO_out voltage is established according to a voltage range of the Vbatt supply voltage and a desired voltage range of the Vramp control voltage. For example, assuming Vbatt has an operating range between [3.45, 3.60] volts and the Vramp control voltage has an operating range of [0, 1.60] volts, then according to one exemplary embodiment the scaling factor can be chosen to be 3.4/1.6. Such scaling factor is provided by the resistors (R1, R2) and takes into consideration a voltage drop across the equivalent $R_{ON}$ resistors of the pass devices (101, 102) at full power, which can be up to 0.2 volts for a full power current of 2 A drawn by the RF PA (150) and a combined $R_{ON}$ resistance of the pass devices (101, 102) of around 100 mΩ. A person skilled in the art readily understands that as the supply voltage Vbatt decreases (e.g. battery discharges), LDO_out voltage is not able to follow the Vramp control voltage according to the scaling factor when full power is requested (Vramp=1.6 V); accordingly, the OpAmp overdrives the gate of the pass device (101) to obtain the desired LDO_out voltage causing the pass device to transition into its triode region of operation.

With further reference to FIG. 6, as the current through the two legs, (M1a, M5a) and (M1b, M6a), of the differential OpAmp section (610) is constant, as preset by the biasing current $I_{B'}$ provided by the biasing circuit (620), the closed loop configuration will try to null a difference in current through the two legs based on the input voltages to the OpAmp section (610), and therefore establish a same current through both such legs. The current through each of the legs of the differential OpAmp section (610) is mirrored, with some gain, and then further mirrored to a push-pull output stage (M6b, M7b) of the OpAmp section (610) where the output node Out is provided. Drive capability (current sink, current source) of the push-pull output stage (M6b, M7b) being therefore a function of the biasing (tail) current $I_{B'}$ provided to the differential OpAmp section (610) by the biasing circuit (620). A person skilled in the art readily understands that such biasing current has a direct influence on a power consumption of the differential OpAmp section (610) as a larger biasing current can cause a higher power consumption.

With continued reference to FIG. 6, the output node Out of the differential OpAmp section (610) drives the gate of the pass device (101) which in turn controls the current through the second pass device (102), where the devices (101, 102) are cascoded. In the exemplary implementation depicted in FIG. 6, biasing voltage to the gate of the second pass device (102) is provided by a voltage divider resistor network (R601, R602) coupled to the supply voltage Vbatt. A person skilled in the art readily understands the principle of operation of the cascoded pass devices (101, 102) and will know of other biasing methods for the gate of the pass device (102). As previously discussed, one or more pass devices in a cascoded configuration can be used with the circuit depicted in FIG. 6, such as, for example, 2, 3, 4, 5 or more pass devices arranged in a cascode configuration, as the number of cascoded devices can be dependent on a desired maximum voltage drop across the pass devices during operation of the circuit. Such maximum voltage drop can be a function of the supply voltage Vbatt, as generally LDO_out can vary between 0 volts and a voltage close to Vbatt.

The current boosting circuit (650) according to the present disclosure depicted in FIG. 6 provides a current boost to the biasing circuit (620) in order to reduce the delay in driving the pass device (101) back into its saturation region of operation. According to an embodiment of the present disclosure, the amplitude of the current boost, $I_{boost}$, can be controlled by a resistor R6 which is connected to a node of the biasing circuit (620) common to transistors (M44a, M46b). In the biasing circuit (620), transistor M46a in combination with resistor R9 are used to generate a biasing current $I_B$ which is mirrored through the transistor M46b. In turn the current boost $I_{boost}$ is added to the biasing current $I_B$ to generate a current $I_{B'}=I_B+I_{boost}$, which is mirrored by transistor M37c and thereby fed to the two legs (M1a, M5a) and (M1b, M6a) of the differential OpAmp section (610). According to an embodiment of the present disclosure, control of the amplitude of the current boost can in turn be used to control the timing and shape of the power response curve (e.g. LDO_out voltage). A person skilled in the art will understand that the resistor R6 can be a programmable, variable, or configurable resistor. Alternatively, resistor R6 can be an active device, such as a transistor, where an equivalent resistance value of the active device can be controlled through a control voltage (e.g. gate voltage of a transistor) applied to the device.

As noted above, current boosting is enabled when two conditions are met: first, the pass device (101) operates in its triode region of operation, and second, the OpAmp (115) is ramping down under control of the Vramp control voltage. As further noted above, due to the high capacitive load (Cgs) coupled to the output node, Out, of the differential OpAmp section (610) (which is also the output node of the OpAmp115) and relative low current drive capability of the push-pull output stage (M6b, M7b) of the differential OpAmp section (610), a voltage change at the output node, Out, under such high capacitive load can be difficult to detect. Accordingly, the current boosting circuit (650) of the present disclosure mirrors the transistors (M6b, M7b) of the push-pull output stage via transistors (M6c, M7c) to create a mirrored output node Mir_Out with relatively low capacitive coupling, which can therefore immediately reflect a request for a ramping down of the output of the OpAmp (115). Such request results in a voltage increase at the mirrored output node Mir_Out, which turns ON the NMOS transistor M3 into conduction. Therefore, transistor M3 is used to detect the request for ramping down of the OpAmp (115) as reflected by the mirrored output node Mir_Out.

With continued reference to the current boosting circuit (650) of FIG. 6, according to one embodiment of the present disclosure, the mirrored output node Mir_Out is an asymmetrical mirrored output node, that is: it is not symmetrical to the output node, Out, that it mirrors. In such case, the transistors (M6c, M7c) used to mirror the output node, Out, of the output stage, are not scaled proportionally (skewed) to the transistors (M6b, M7b) of the output stage. The (skewed) scaling according to the present embodiment can ensure that the transistor M3 is OFF when the OpAmp (115) stops ramping and the currents in the transistors Mia and M2b of the differential input stage of the OpAmp (115) are about equal. This in turn can ensure that no additional bias current is added to the biasing circuit (620) when the OpAmp (115) is not ramping. According to an exemplary embodiment of the present disclosure, the device ratio M6c/M7c of the transistors (M6c, M7c) of the mirrored output node, Mir_out, is slightly larger than the device ratio M6b/M7b of the transistors (M6b, M7b) of the main output node. A person skilled in the art would recognize that a needed minimum difference between the device size ratios M6c/M7c and M6b/M7b is dictated by the matching properties of the devices. In this exemplary case, a 10% difference is sufficient.

With further reference to the current boosting circuit (650) of FIG. 6, transistor M4 is used to detect the condition where the pass device (101) operates in its triode region of operation. In such condition, and as exemplified in the graphs of FIGS. 5A-5B, the output node Out of the OpAmp (115), connected to the gate of the PMOS transistor M4, is still low as the pass device (101) is at minimum $R_{ON}$, and the LDO_output voltage, connected to the source of the transistor M4, is high. This causes the PMOS transistor M4 to turn ON. It should be noted that usage of the transistor M4 is optional, as a configuration where the transistor M4 is not used, such as the configuration depicted in FIG. 7, can also be envisioned.

Figure 7:
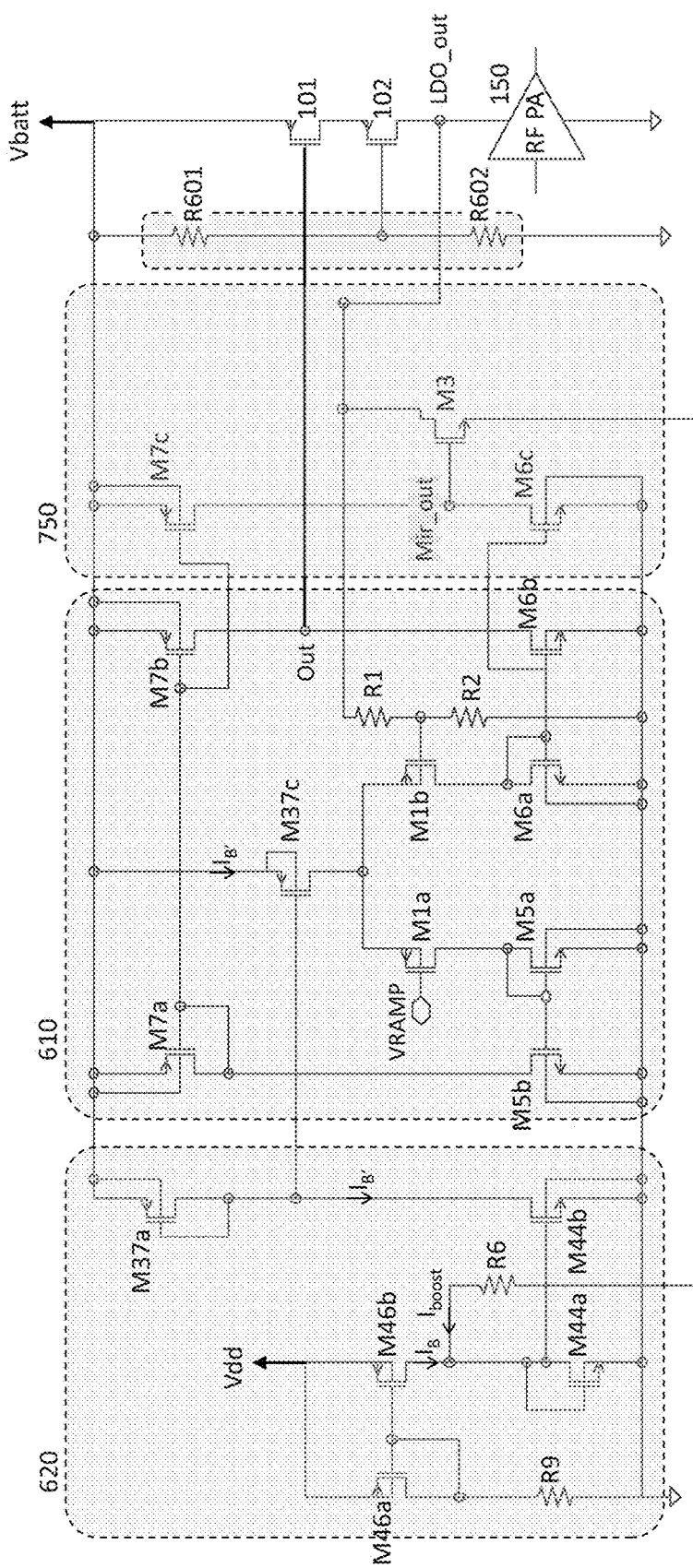
FIG. 7 shows a more detailed schematic representation of the LDO regulator of FIG. 1, where a current boosting circuit according to a further embodiment of the present disclosure used. Such current boosting allows boost of a current to an operational amplifier during a ramping of an output of the operational amplifier irrespective of a mode of operation of a passive device coupled to the output of the operational amplifier.

FIG. 7 shows a schematic representation of an alternative embodiment similar to the embodiment depicted in FIG. 6 where the current boosting circuit (750) is devoid of the transistor M4 used in the current boosting circuit (650) of FIG. 6. In the embodiment, according to the present disclosure, depicted in FIG. 7, current boosting is provided irrespective of a region of operation of the pass device (101) and only during a ramping of the Vramp signal as detected through the mirrored output node, Mir_out. In the absence of the transistor M4 in the current boosting circuit (750), an asymmetrical mirrored output node as previously described can guarantee that the boost current is turned off when the OpAmp (115) is not ramping under control of the Vramp control voltage. Since the current boosting is provided irrespective of the region of operation of the pass device (101), it can be provided irrespective of a mode of operation of the LDO regulator discussed above: essentially open loop and closed loop.

With continued reference to FIG. 6, both devices M3 and M4 turned ON, an additional current boost $I_{boost}$ is conducted from a node carrying the LDO_out voltage to the biasing circuit (620), through transistors M3, M4 and resistor R6, where the current boost $I_{boost}$ is added to the bias current $I_B$ generated by the biasing circuit (620). Such current boost increases the effective biasing current $I_{B'}$ of the differential OpAmp section (610), and therefore increases the output current drive (source/sink) capability of the push-pull output stage (M6b, M7b) of the differential OpAmp section (610), which allows a faster discharge of the capacitive load (Cgs) coupled to the output node Out. Quick discharge of the capacitive load in turn allows for a quick transition of the pass device (101) from its triode region of operation to its saturation region of operation, which brings the LDO regulator back to its high gain regulated mode of operation. As the pass device (101) is brought into its saturation region of operation, the LDO_Out voltage decreases and the gate voltage of the pass device (101) increases which in combination turn OFF the PMOS transistor M4 and stop conduction of the current boost $I_{boost}$ into the biasing circuit. This in turn ensures stable operation of the closed loop control of the output voltage LDO_out and avoids instability, which can be caused by injection of such high current (e.g. $I_{boost}$) while operating in the high gain regulated mode. As transistor M4 is turned OFF, no current flows through the conduction path defined by the current boosting circuit (650) and the resistor R6, and therefore the current boosting circuit does not influence operation (e.g. power consumption) of the overall circuit depicted in FIG. 6.

According to further embodiments of the present disclosure, boosting current can be provided during a transition from saturation region to triode region of operation of the pass device (101) which occurs during a ramping up of the Vramp control voltage to provide full power to the RF PA (150). As the Cgs capacitance of the pass device (101) increases from a low value when in the saturation region, to a higher value when in the triode region, ramping up to full power during the transition stage can be slowed down. Therefore, it may be desirable, in some applications, to control (e.g. increase) such ramping up. This can be achieved by simply changing the device M3 in the schematic on FIG. 6 from an NMOS to a PMOS type. The circuit operation will be exactly the same except the boost of the the OpAmp bias current would take place during the rising edge of the Vramp signal. It should be noted that a person skilled in the art can readily combine the NMOS and PMOS version of device M3 and achieve current boost during both rising and falling edges of the VRAMP signal.

It should be noted that FIG. 6 represents schematic details of an exemplary circuit which can be used as the OpAmp (115) of FIG. 1. A person skilled in the art will know of a multitude of different circuits for representing an OpAmp and therefore the exemplary circuit represented in FIG. 6 should not be considered as limiting the scope of the present disclosure. In general, an OpAmp includes building blocks, such as a biasing circuit, input differential section, output section, etc., as described in relation to the exemplary circuit of FIG. 6, and therefore the teachings of the present disclosure can equally be applied to any OpAmp configuration. In particular, the output section that drives the output node of the amplifier can be mirrored to create a low capacitively coupled mirrored output node, the mirrored output node can be used to drive a ramp (e.g. ramp down) detection transistor (e.g. M3 of FIG. 6), a difference between an output voltage LDO_Out and a voltage at an output node (e.g. Out of FIG. 6) of the output section of the OpAmp can be used to detect operation of a pass device driven by the output section in the triode region via a triode region detection transistor (e.g. M4 of FIG. 6), and a current can be injected into the biasing circuit of the OpAmp based on the ON states of the ramp detection transistor and the triode region detection transistor.

Furthermore, it should be noted that the teachings according to the present disclosure can be equally applied to systems using OpAmps in a closed loop configuration to drive a relatively high capacitive load with a high slew rate pulse signal while reducing overall power consumption, and not necessarily limit the present teachings to an LDO regulator driving an RF power amplifier. Teachings according to the present disclosure can allow to control (e.g. minimize) the time that takes a low power amplifier, such as an OpAmp, to drive an output device (high current) from its triode region of operation to its saturation region of operation and vice versa. For example, the present teachings can be used in a DC-DC converter used in a pulsed mode of operation where two series-connected output transistors are sequentially driven into conduction.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A circuital arrangement for providing burst power at an output voltage node, the circuital arrangement comprising:
   a pass device, configured to provide a conduction path between a supply voltage node and the output voltage node through operation of the pass device in one of a saturation region and a triode region of the pass device;

an operational amplifier, coupled, through an output node of the operational amplifier, to an input node of the pass device, the operational amplifier configured to provide a control voltage at the output node of the operational amplifier to the input node of the pass device to control the region of operation and biasing of the pass device; and a current boost circuit coupled to the output voltage node and to the output node of the operational amplifier, the current boost circuit comprising a mirrored circuit that mirrors a current at an output stage of the operational amplifier in correspondence of the control voltage to provide a mirrored output node;

wherein:

the current boost circuit is configured to provide a current boost to the operational amplifier to increase a current drive capability of the output stage of the operational amplifier during a transition of the pass device from one of the saturation region and the triode region of operation to the other of the saturation region and the triode region of operation based on a detected ramping of the control voltage at the mirrored output node.

2. The circuital arrangement of claim 1, wherein the pass device comprises at least a first transistor comprising:

a gate terminal as the input node of the pass device, the gate terminal connected to the output node of the operational amplifier;

a source terminal coupled to the supply voltage node; and a drain terminal coupled to the output voltage node.

3. The circuital arrangement of claim 2, wherein the pass device further comprises a second transistor coupled between the drain of the first transistor and the output voltage node, the first transistor and the second transistor configured in a cascode configuration.

4. The circuital arrangement of claim 1, wherein the operational amplifier and the pass device are arranged in a closed loop, the closed loop comprising a first mode of operation and a second mode of operation, the first mode of operation having a loop gain substantially higher than a loop gain of the second mode of operation, wherein:

during the first mode of operation, the pass device operates in the saturation region and the output voltage node tracks an input voltage provided to a first input of the operational amplifier, and during the second mode of operation, the pass device operates in the triode region and the output voltage node tracks the supply voltage node.

5. The circuital arrangement of claim 4, wherein:

operation in one of the first mode of operation and the second mode of operation is based on the input voltage provided to the first input of the operational amplifier, and a scaled version of a voltage at the output voltage node is provided to a second input of the operational amplifier.

6. The circuital arrangement of claim 5, wherein:

the input voltage is according to a pulse shape with a predetermined rising slope, a predetermined falling slope and a high voltage level, during the rising slope of the input voltage, the closed loop operates in the first mode of operation, and the current boost circuit does not provide the current boost, during a transition from the rising slope to the high voltage level of the input voltage, the closed loop operates in the second mode of operation, during the high voltage level of the input voltage, the closed loop operates in the second mode of operation, and the current boost circuit does not provide the current boost, during a transition from the high voltage level to the falling slope of the input voltage, the closed loop operates in the second mode of operation, and during the falling slope of the input voltage, the closed loop operates in the first mode of operation, and the current boost circuit does not provide the current boost.

7. The circuital arrangement of claim 5, wherein the current boost circuit provides the current boost in one or both of: a) during a transition from a rising slope to a high voltage level of the input voltage, and b) during a transition from a high voltage level to a falling slope of the input voltage.

8. The circuital arrangement of claim 6, wherein scaling of the scaled version of the voltage at the output voltage node provided to the second input of the operational amplifier is based on the high voltage level, a voltage at the supply voltage node, and a drop in voltage across the pass device when the pass device operates in the triode region.

9. The circuital arrangement of claim 6, wherein scaling of the scaled version of the voltage at the output voltage node provided to the second input of the operational amplifier is based on the high voltage level of the input voltage and a desired high voltage at the output voltage node.

10. The circuital arrangement of claim 3, wherein the pass device further comprises additional transistors coupled between the first transistor and the second transistor, the first transistor, the second transistor and the additional transistors configured in a cascode configuration.

11. The circuital arrangement of claim 1, wherein:

the current boost is provided during a transition of the pass device from the triode region of operation to the saturation region of operation, and an amplitude of the current boost is configured to control a discharge speed of a capacitive charge accumulated at an input capacitance of the pass device and thereby affect a transition time of the pass device to transition from the triode region of operation to the saturation region of operation.

12. The circuital arrangement of claim 1, wherein the current boost circuit further comprises:

a ramp detection transistor, configured to detect the ramping of the control voltage at the mirrored output node; and a region of operation detection transistor, configured to detect the region of operation of the pass device based on a difference between a voltage at the output voltage node and the control voltage to the pass device.

13. The circuital arrangement of claim 12, wherein the operational amplifier comprises a biasing circuit configured to provide a biasing current to a differential input stage of the operational amplifier which determines the current drive capability of the output stage of the operational amplifier, wherein:

the ramp detection transistor and the region of operation detection transistor are arranged in a series connection, a source node of the region of operation detection transistor is connected to the output voltage node, and a source node of the ramp detection transistor is connected to the biasing circuit of the operational amplifier through a current boost resistor.

14. The circuital arrangement of claim 13, wherein:

a gate node of the region of operation transistor is connected to the control voltage, a drain node of the region of operation transistor is connected to a drain node of the ramp detection transistor, a gate node of the ramp detection transistor is connected to the mirrored output node, and a source node of the ramp detection transistor is connected to the current boost resistor.

15. The circuital arrangement of claim 14, wherein a value of the current boost resistor comprises one of: a configurable value, a variable value, and a programmable value.

16. The circuit arrangement of claim 13, wherein upon detection of the ramping of the control voltage and a concurrent detection of the triode region of operation of the pass device, the ramp detection transistor and the region of operation transistor provide a conduction path for the current boost to the operational amplifier.

17. The circuital arrangement of claim 16, wherein the current boost is summed, at a node of the biasing circuit connected to the current boost resistor, to a biasing current generated in the biasing circuit, to increase the current drive capability of the output stage of the operational amplifier.

18. A circuital arrangement for providing burst power at an output voltage node, the circuital arrangement comprising:

a pass device, configured to provide a conduction path between a supply voltage node and the output voltage node through operation of the pass device in one of a saturation region and a triode region of the pass device;

an operational amplifier, coupled, through an output node of the operational amplifier, to an input node of the pass device, the operational amplifier configured to provide a control voltage at the node of the operational amplifier to the input node of the pass device to control the region of operation of the pass device; and a current boost circuit coupled to the output voltage node and to the output node of the operational amplifier, the current boost circuit comprising a mirrored asymmetrical circuit that mirrors a current at an output stage of the operational amplifier in correspondence of the control voltage to provide a mirrored asymmetrical output node;

wherein:

the current boost circuit is configured to provide a current boost to the operational amplifier to increase a current drive capability of the output stage of the operational amplifier during a transition of the pass device from one of the saturation region and the triode region of operation to the other of the saturation region and the triode region of operation based on a detected ramping of the control voltage at the mirrored asymmetrical output node.

19. A circuital arrangement for providing burst power at an output voltage node, the circuital arrangement comprising:

a pass device, configured to provide a conduction path between a supply voltage node and the output voltage node through operation of the pass device in one of a saturation region and a triode region of the pass device;

an operational amplifier, coupled, through an output node of the operational amplifier, to an input node of the pass device, the operational amplifier configured to provide a control voltage at the output node of the operational amplifier to the input node of the pass device to control the region of operation of the pass device; and a current boost circuit coupled to the output voltage node and to the output node of the operational amplifier, the current boost circuit comprising a mirrored asymmetrical circuit that mirrors a current at an output stage of the operational amplifier in correspondence of the control voltage to provide a mirrored asymmetrical output node;

wherein:

the current boost circuit is configured to provide a current boost to the operational amplifier to increase a current drive capability of the output stage of the operational amplifier during a detected ramping of the control voltage at the mirrored asymmetrical output node.

20. The circuital arrangement according to claim 18, wherein devices of the mirrored asymmetrical circuit are not scaled proportionally to devices of the output stage of the operational amplifier.

21. The circuital arrangement according to claim 19, wherein devices of the mirrored asymmetrical circuit are not scaled proportionally to devices of the output stage of the operational amplifier.

22. A method for controlling power of a radio frequency (RF) power amplifier (PA), the method comprising:

providing a supply voltage;

providing an operational amplifier;

connecting an output node of the operational amplifier to a control terminal of a pass device, the pass device configured to operate in one of a triode region and a saturation region;

coupling a first terminal of the pass device to the supply voltage;

coupling a second terminal of the pass device to an RF power control terminal of the RF PA;

mirroring an output stage of the operational amplifier;

based on the mirroring, providing a mirrored output node, the mirrored output node having a capacitive load substantially smaller than a capacitive load of the output node in correspondence of a capacitance at the control terminal of the pass device;

inputting a ramp voltage to the operational amplifier;

based on the inputting, detecting the ramp voltage at the mirrored output node;

based on the inputting, controlling the pass device to transition from one of the triode region and the saturation region to the other region;

based on the detecting and the controlling, detecting the transition;

based on the detecting the transition, injecting a current boost into the operational amplifier;

based on the injecting, increasing a current drive capability of the output stage;

based on the increasing, controlling a transition time of the pass device to transition from the one of the triode region and the saturation region to the other region; and based on the controlling, reducing an error voltage at the RF power control terminal of the RF PA, wherein the error voltage is in correspondence of a desired voltage dictated by the input ramp voltage and an effective voltage at the RF power control terminal.

23. A method for increasing a current drive capability of an amplifier, the method comprising:

providing a supply voltage;

providing an operational amplifier;

connecting an output node of the operational amplifier to a control terminal of a pass device, the pass device configured to operate in one of a triode region and a saturation region;

coupling a first terminal of the pass device to the supply voltage;

coupling a second terminal of the pass device to an RF power control terminal of the RF PA;

asymmetrically mirroring an output stage of the operational amplifier;

based on the asymmetrically mirroring, providing an asymmetrical mirrored output node, the asymmetrical mirrored output node having a capacitive load substantially smaller than a capacitive load of the output node in correspondence of a capacitance at the control terminal of the pass device;

inputting a ramp voltage to the operational amplifier;

based on the inputting, detecting the ramp voltage at the asymmetrical mirrored output node;

based on the detecting, injecting a current boost into the operational amplifier, and based on the injecting, increasing a current drive capability of the output stage.

24. The method according to claim 22, wherein the pass device comprises a plurality of stacked transistors configured in a cascode configuration.

25. The method according to claim 23, wherein the pass device comprises a plurality of stacked transistors configured in a cascode configuration.

* * * * *